US009973152B2

(12) United States Patent
Otani et al.

(10) Patent No.: US 9,973,152 B2
(45) Date of Patent: May 15, 2018

(54) CURRENT-LIMITING IN AN AMPLIFIER SYSTEM

(71) Applicant: Texas Instruments Incorporated, Dallas, TX (US)

(72) Inventors: Daijiro Otani, Tokyo (JP); Keita Ikai, Tokyo (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/350,773

(22) Filed: Nov. 14, 2016

(65) Prior Publication Data

US 2017/0063313 A1 Mar. 2, 2017

Related U.S. Application Data

(62) Division of application No. 14/267,515, filed on May 1, 2014, now Pat. No. 9,495,982.

(51) Int. Cl.
| | |
|---|---|
| *H03F 3/45* | (2006.01) |
| *H03F 1/52* | (2006.01) |
| *G11B 5/48* | (2006.01) |
| *G11B 5/596* | (2006.01) |
| *H03F 3/30* | (2006.01) |

(52) U.S. Cl.
CPC ............... *H03F 1/523* (2013.01); *G11B 5/48* (2013.01); *G11B 5/4873* (2013.01); *G11B 5/596* (2013.01); *G11B 5/59622* (2013.01); *H03F 1/52* (2013.01); *H03F 3/303* (2013.01); *H03F 3/45192* (2013.01); *G11B 5/483* (2015.09); *H03F 2200/426* (2013.01); *H03F 2200/462* (2013.01)

(58) Field of Classification Search
CPC ......... H03F 1/523; H03F 3/45192; H03F 1/52
USPC ......................................... 330/255, 257, 258
See application file for complete search history.

(56) References Cited

U.S. PATENT DOCUMENTS

| | | | | |
|---|---|---|---|---|
| 5,789,982 | A | * | 8/1998 | Uscategui ............. H03F 3/3076 330/255 |
| 6,747,836 | B2 | | 6/2004 | Stevens et al. |
| 6,900,959 | B1 | | 5/2005 | Gardner et al. |
| 7,340,235 | B1 | | 3/2008 | Madsen et al. |
| 8,446,687 | B2 | | 5/2013 | Hironaka et al. |
| 8,717,703 | B2 | | 5/2014 | Matsuzawa et al. |
| 8,724,254 | B1 | | 5/2014 | Tang et al. |

(Continued)

OTHER PUBLICATIONS

Prosecution History from U.S. Appl. No. 14/267,515, filed May 1, 2014, from May 1, 2014 to Oct. 27, 2016 (173 pages).

*Primary Examiner* — Khanh V Nguyen
*Assistant Examiner* — Khiem Nguyen
(74) *Attorney, Agent, or Firm* — Gregory J. Albin; Charles A. Brill; Frank D. Cimino

(57) ABSTRACT

One example includes an amplifier system. The system includes a gain stage configured to conduct a gain current in response to an input voltage. The system also includes a current limit stage coupled to the gain stage and being configured to one of source and sink the gain current and to define a limit amplitude of the gain current during a current limit condition. The system further includes an output stage coupled to the gain stage and configured to conduct an output current through an output node in response to the gain current, the output current having a maximum amplitude during the current limit condition that is proportional to the limit amplitude.

13 Claims, 2 Drawing Sheets

(56) References Cited

U.S. PATENT DOCUMENTS 8,934,190 B2 1/2015 Matsuzawa
2008/0259491 A1 10/2008 Kisaka \* cited by examiner

CURRENT-LIMITING IN AN AMPLIFIER SYSTEM

RELATED APPLICATIONS

This patent application is a divisional of U.S. patent application Ser. No. 14/267,515, filed May 1, 2014, which is incorporated herein by reference in its entirety.

TECHNICAL FIELD

This disclosure relates generally to electronic circuit systems, and more specifically to current-limiting in an amplifier system.

BACKGROUND

Amplifier systems can be implemented for a variety of electronic circuit applications to increase an amplitude of an input signal in generating an output signal. As an example, current amplifiers can generate an output current having an amplitude that is greater than the amplitude of a respective input current. Similarly, voltage amplifiers can generate an output voltage having an amplitude that is greater than the amplitude of a respective input voltage. One example application for an amplifier system is for servo control for the motion of mechanical components, such as in a dual-stage actuator in a hard-disk drive (HDD). As an example, the input signal can be provided for positioning control of a head for reading and writing data, such that the amplifier can provide the output signal to move the head.

SUMMARY

One example includes an amplifier system. The system includes a gain stage configured to conduct a gain current in response to an input voltage. The system also includes a current limit stage coupled to the gain stage and being configured to one of source and sink the gain current and to define a limit amplitude of the gain current during a current limit condition. The system further includes an output stage coupled to the gain stage and configured to conduct an output current through an output node in response to the gain current, the output current having a maximum amplitude during the current limit condition that is proportional to the limit amplitude.

Another embodiment includes a gain stage comprising a plurality of transistors configured to conduct at least one of a sinking current and a sourcing current in response to an input voltage. The system also includes at least one current limit stage comprising a current mirror configured to provide the at least one of the sinking current and the sourcing current and to define a limit amplitude of the at least one of the sinking current and the sourcing current during a current limit condition. The system further includes an output stage coupled to the gain stage and configured to conduct an output current through an output node in response to the at least one of the sinking current and the sourcing current to provide an output voltage at the output node, the output current having a maximum amplitude during the current limit condition that is proportional to the limit amplitude.

Another embodiment includes a hard-disk drive (HDD) system. The system includes a magnetic disk configured to store data and a spindle motor configured to control rotation of the magnetic disk. The system also includes a head configured to write data to and read data from the magnetic disk. The system further includes a dual-stage actuator configured to cooperate with a voice coil motor to position the head with respect to the magnetic disk in response to an output voltage generated by an amplifier system. The amplifier system includes a gain stage configured to conduct a gain current in response to an input voltage. The amplifier system also includes a current limit stage coupled to the gain stage and which is configured to one of source and sink the gain current and to define a limit amplitude of the gain current during a current limit condition. The amplifier system further includes an output stage coupled to the gain stage and configured to conduct an output current through an output node in response to the gain current to provide an output voltage at the output node, the output current having a maximum amplitude during the current limit condition that is proportional to the limit amplitude.

DETAILED DESCRIPTION

This disclosure relates generally to electronic circuit systems, and more specifically to current-limiting in an amplifier system. The amplifier system can be, for example, a voltage amplifier configured to generate an output voltage that is an amplified version of an input voltage. As an example, the input voltage can be a differential voltage that is provided via feedback. The amplifier system can include a gain stage, a current limit stage, and an output stage. The gain stage can be configured to conduct a gain current, such as a sinking current or a sourcing current, based on the input voltage. As an example, the input voltage can activate one or more transistors in the gain stage to conduct the gain current. The output stage is coupled to the gain stage, and is configured to generate an output current that is based on the gain current, and to provide an output voltage based on the output current.

The current limit stage can be configured to define a limit amplitude of the gain current associated with a current limit condition, with the current limit condition corresponding to a current amplitude limit associated with the output current. As an example, the current limit stage can include a current limit stage configured to sink the gain current or source the gain current based on a difference between the two voltages that constitute the differential input voltage. For example, the gain stage can include sets of cross-coupled transistors that, during a current limit condition, are mutually exclusively activated to conduct the sinking gain current or the sourcing gain current, respectively. The current limit stage is configured to generate the gain current (e.g., sinking and/or sourcing current), and can define a limit amplitude associated with the gain current via a current mirror, such that the output current has an amplitude limit that is proportional to the defined limit of the gain current.

Figure 1:
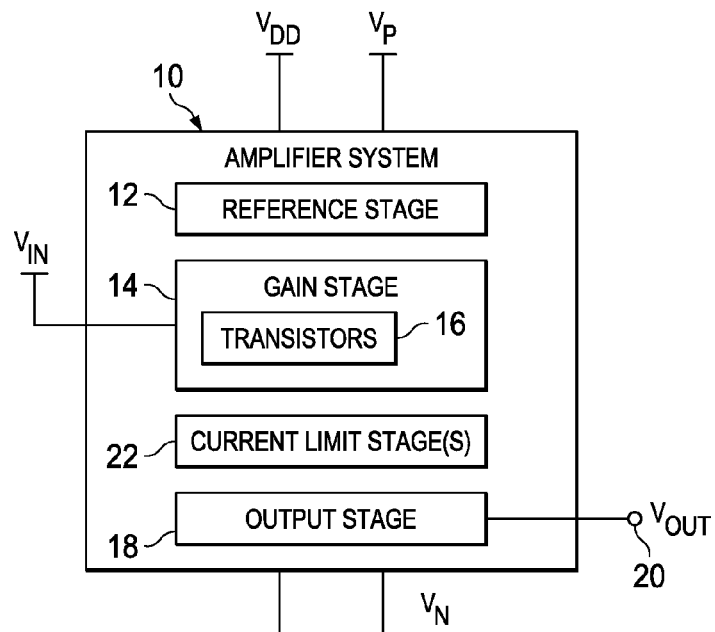
FIG. 1 illustrates an example of an amplifier system.

FIG. 1 illustrates an example of an amplifier system 10. The amplifier system 10 can correspond to a voltage amplifier, such as can be implemented to provide an output voltage $V_{OUT}$ that has an increased amplitude relative to an input voltage $V_{IN}$. As an example, the amplifier system 10 can be implemented in a variety of electronics applications, such as for a dual-stage actuator driver in a hard-disk drive (HDD) system.

The amplifier system 10 includes a reference stage 12 that is configured to set at least one predetermined reference voltage based on a high-voltage rail and a low-voltage rail, demonstrated in the example of FIG. 1 as a voltage $V_{DD}$ and ground, respectively. As an example, the voltage $V_{DD}$ can be approximately 5 volts. The amplifier system 10 also includes at least one gain stage 14 that includes a plurality of transistors 16. The gain stage(s) 14 are configured to conduct a gain current that is generated based on the input voltage $V_{IN}$. As an example, the transistors 16 can be activated based on the input voltage and the reference voltage(s) to conduct the gain current. For example, the transistors 16 can include two pairs of cross-coupled transistors as part of a first of the gain stage(s) 14, with a first transistor of each pair being controlled by one of the one or more reference voltages and a second transistor of each pair being controlled based on the input voltage $V_{IN}$. The input voltage $V_{IN}$ can be, for example, a differential input voltage $V_{IN}$ having a first voltage and a second voltage that are provided via feedback.

As an example, a first of the gain stage(s) 14 can be configured to conduct the gain current as a sinking gain current or a sourcing gain current based on the input voltage $V_{IN}$. For example, the first gain stage(s) 14 can provide the gain current as a sourcing gain current based on a positive difference between the differential voltages of the input voltage $V_{IN}$ or as a sinking gain current based on a negative difference between the differential voltages of the input voltage $V_{IN}$. As an example, the first of the gain stage(s) 14 can be configured to mutually exclusively activate a given one pair of the cross-coupled transistors of the transistors 16 in response to a difference between the first and second voltages of the differential input voltage $V_{IN}$ exceeding a predetermined threshold.

The amplifier system 10 also includes an output stage 18 that is configured to generate an output current based on the gain current. For example, the output stage 18 can be coupled to a second of the gain stage(s) 14 that includes at least one current mirror that can be configured to conduct the gain current from the first transistor in each of the pairs of cross-coupled transistors in the transistors 16, such that the mirrored gain current can control at least one transistor in the output stage 18. The output stage 18 can include a source-follower arrangement of transistors that are controlled by the mirrored gain current, such that the source-follower arrangement of transistors can be configured to conduct the output current through an output node 20, such as sourced by a voltage $V_P$ or sunk to a voltage $V_N$, respectively, to provide the output voltage $V_{OUT}$ corresponding to an increased magnitude of the input voltage $V_{IN}$. For example, the voltage $V_P$ can have an amplitude that is greater than the amplitude of the voltage $V_{DD}$, such as approximately 17.5V. As an example, the output current can be proportional to the gain current based on respective gate-widths of the transistors between the transistors in the gain stage(s) 14 and the source-follower arrangement of transistors in the output stage 18. Additionally, the source-follower arrangement of the transistors in the output stage 18 can provide a low output impedance with respect to the output node 20, such as can be required in certain voltage amplifier applications.

In the example of FIG. 1, the amplifier system 10 further includes at least one current limit stage 22 that is configured to limit the amplitude of the output current during a current limit condition to substantially prevent damage to the amplifier system 10 or associated electronics. As described herein, a "current limit condition" is defined as a condition in which the output current flows from the amplifier system 10 via the output node 20, or into the amplifier system via the output node 20, via the output stage 18 at a maximum amplitude, as described herein, such as in response to a short-circuit or a very low resistance current path from the output node 20 to a low-voltage rail (e.g., ground). The current limit stage(s) 22 can include a current mirror that is configured to provide the gain current that the gain stage(s) 14 conduct, and to define an amplitude limit of the gain current, which can thus limit the amplitude of the output current based on the proportionality of the output current with respect to the gain current.

For example, the current limit stage(s) 22 can include a sourcing current limit stage and a sinking current limit stage that are respectively configured to conduct the gain current via the gain stage(s) 14. Each of the sourcing and sinking current limit stage(s) 22 can include a current mirror that conducts a predetermined current that can define a maximum amplitude of the gain current. Therefore, because the output current is proportional to the gain current, the output current can have a maximum amplitude that is proportional to the amplitude limit of the gain current, as defined by the current limit stage(s) 22. Accordingly, in response to a current limit condition, the output current can have a maximum amplitude that is set by the current limit stage(s) 22.

Figure 2:
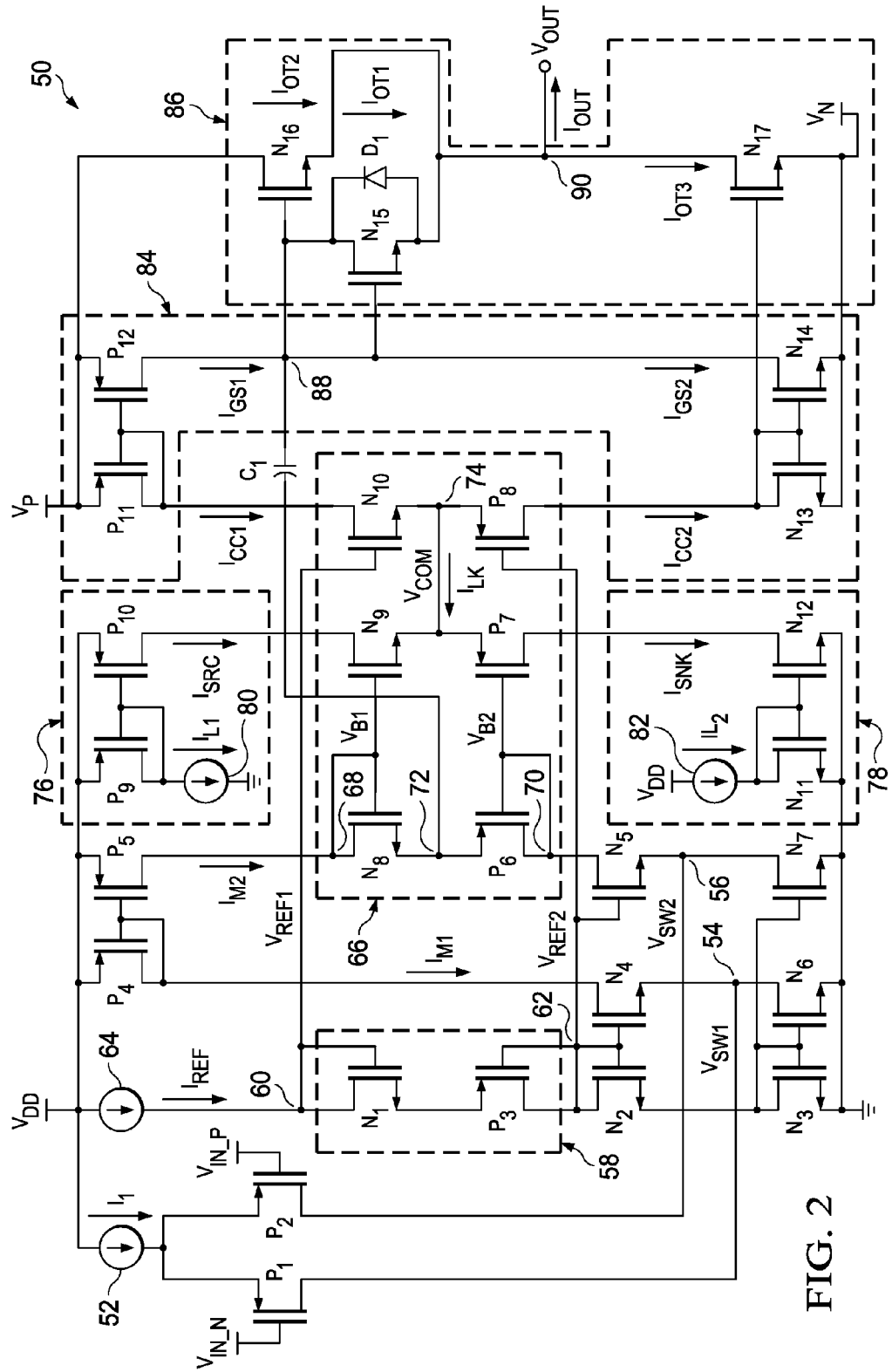
FIG. 2 illustrates an example of an amplifier circuit.

FIG. 2 illustrates an example of an amplifier circuit 50. The amplifier circuit 50 can correspond to a voltage amplifier to provide an output voltage $V_{OUT}$ that has an increased amplitude relative to a differential input voltage, demonstrated in the example of FIG. 2 as a first voltage $V_{IN\_N}$ and a second voltage $V_{IN\_P}$. As an example, the amplifier circuit 50 can be implemented in a dual-stage actuator driver in an HDD system. For example, the amplifier circuit 50 can correspond to the amplifier system 10 in the example of FIG. 1. Therefore, reference is to be made to the example of FIG. 1 in the following description of the example of FIG. 2.

In the example of FIG. 2, the first input voltage $V_{IN\_N}$ and the second input voltage $V_{IN\_P}$ are provided to respective gates of P-channel metal-oxide semiconductor field-effect transistors (MOSFETs) $P_1$ and $P_2$, described hereinafter as "P-FETs". The P-FET $P_1$ interconnects a current source 52 and a first control node 54, and the P-FET $P_2$ interconnects the current source 52 and a second control node 56. The current source 52 is configured to conduct a current $I_1$ from the voltage $V_{DD}$. The input voltages $V_{IN\_P}$ and $V_{IN\_N}$ can be approximately equal during a steady-state normal operating condition of the amplifier circuit 50, such as based on feedback to establish the normal operating condition. As another example, the amplifier circuit 50 can be configured as an inverting amplifier, such that the input voltage $V_{INP}$ can be substantially fixed at a predetermined amplitude, such as less than 1V (e.g., approximately 900 mV), and the input voltage $V_{IN\_N}$ can have an amplitude that varies about the amplitude of the input voltage $V_{IN\_P}$ (e.g., +/−700 mV of the input $V_{IN\_P}$). The input voltages $V_{IN\_N}$ and $V_{IN\_P}$ can operate the P-FETs $P_1$ and $P_2$ in the saturation region to provide a voltage $V_{SW1}$ on the first control node 54 and a voltage $V_{SW2}$ on the second control node 56, respectively.

The amplifier circuit 50 includes a reference stage 58 that includes an N-channel MOSFET (hereinafter, "N-FET") $N_1$ and a P-FET $P_3$ that are each diode-connected in series and interconnect a first reference node 60 and a second reference node 62. A current source 64 provides a reference current $I_{REF}$ from the voltage $V_{DD}$ through the N-FET $N_1$ and the P-FET $P_3$, as well as a diode-connected N-FET $N_2$ that is coupled to the P-FET $P_3$ and a diode-connected N-FET $N_3$ that is coupled to the N-FET $N_2$ to ground. Based on the diode-connection of the N-FET $N_1$, the P-FET $P_3$, and the N-FETs $N_2$ and $N_3$ between the voltage $V_{DD}$ and a low-voltage rail, demonstrated in the example of FIG. 2 as ground, the reference nodes 60 and 62 have respective reference voltages $V_{REF1}$ and $V_{REF2}$ that are substantially constant.

In addition, the gate of the N-FET $N_2$ is coupled to a gate of an N-FET $N_4$ and an N-FET $N_5$, and the gate of the N-FET $N_3$ is coupled to a gate of an N-FET $N_6$ and an N-FET $N_7$. Therefore, the N-FETs $N_6$, and $N_7$ are arranged as current mirrors with respect to the N-FET $N_3$, and the N-FETs $N_2$, $N_4$, and $N_5$ are arranged as cascode stages with respect to the N-FETs $N_3$, $N_6$, and $N_7$, respectively. The first control node 54 interconnects the source of the N-FET $N_4$ and the drain of the N-FET $N_6$, and the second control node 56 interconnects the source of the N-FET $N_5$ and the drain of the N-FET $N_7$. The drain of the N-FET $N_4$ is coupled to a diode-connected P-FET $P_4$ having a common gate connection and a common source connection (e.g., at the voltage $V_{DD}$) with a P-FET $P_5$, such that the P-FET $P_5$ is arranged as a current mirror with respect to the P-FET $P_4$. As a result, the reference current $I_{REF}$ is mirrored through the P-FET $P_4$ and the N-FET $N_4$ as a current $I_{M1}$ and through the N-FET $N_5$ as a current $I_{M2}$, such that the currents $I_{M1}$ and $I_{M2}$ are mirrored versions of the current $I_{REF}$ minus one half of the current $I_1$ in normal operating conditions. However, a relative magnitude of the voltages $V_{SW1}$ and $V_{SW2}$ at the respective control nodes 54 and 56 can control activation of the N-FETs $N_4$ and $N_5$ based on the coupling of the respective control nodes 54 and 56 to the sources of the N-FETs $N_4$ and $N_5$. Thus, the relative amplitudes of the currents $I_{M1}$ and $I_{M2}$ can be controlled based on the relative amplitudes of the respective voltages $V_{SW1}$ and $V_{SW2}$.

The amplifier circuit 50 also includes a first gain stage 66. The first gain stage 66 includes a diode-connected N-FET $N_8$ having a common gate connection at a first bias node 68 with an N-FET $N_9$, and includes a diode-connected P-FET $P_6$ having a common gate connection at a second bias node 70 with a P-FET $P_7$. Therefore, the N-FET $N_9$ and the P-FET $P_7$ operate as a current mirror with respect to the N-FET $N_8$ and the P-FET $P_6$. In the example of FIG. 2, the first bias node 68 is also coupled to the drain of the P-FET $P_5$ and has a voltage $V_{B1}$, and the second bias node 70 is also coupled to the drain of the N-FET $N_5$ and has a voltage $V_{B2}$. As described in greater detail herein, the voltages $V_{B1}$ and $V_{B2}$ are controlled by the currents $I_{M1}$ and $I_{M2}$ via the voltages $V_{SW1}$ and $V_{SW2}$, and are thus controlled by the differential input voltage $V_{IN\_P}$ and $V_{IN\_N}$. In addition, the first gain stage 66 includes an N-FET $N_{10}$ and a P-FET $P_8$ that are controlled by the reference voltages $V_{REF1}$ and $V_{REF2}$, respectively, and are thus arranged as a current mirror with respect to the N-FET $N_1$ and the P-FET $P_3$ in the reference stage 58. The N-FET $N_8$ is coupled via a common source connection to the P-FET $P_6$ at a node 72, and the sources of the N-FETs $N_9$ and $N_{10}$ and the sources of the P-FETs $P_7$ and $P_8$ are all coupled at a node 74 having a voltage $V_{COM}$. Therefore, the N-FETs $N_9$ and $N_{10}$ and the P-FETs $P_7$ and $P_8$ are arranged as cross-coupled pairs of transistors, with the N-FET $N_9$ and the P-FET $P_8$ constituting a first pair of the cross-coupled transistors and the N-FET $N_{10}$ and the P-FET $P_7$ constituting a second pair of the cross-coupled transistors, as described in greater detail herein.

The amplifier circuit 50 also includes a first current limit stage 76 and a second current limit stage 78. The first current limit stage 76 is configured to generate a gain current as a sourcing current $I_{SRC}$ that is provided to the first gain stage 66, demonstrated in the example of FIG. 2 as being provided to a drain of the N-FET $N_9$. In the example of FIG. 2, the first current limit stage 76 includes a diode-connected P-FET $P_9$ having a common gate connection with a P-FET $P_{10}$ and a common source connection to the voltage $V_{DD}$. Therefore, the P-FETs $P_9$ and $P_{10}$ cooperate as a current mirror. The first current limit stage 76 also includes a current source 80 that is configured to conduct a substantially constant current $I_{L1}$ from the voltage $V_{DD}$ through the P-FET $P_9$ to ground. Therefore, the substantially constant current $I_{L1}$ can define a maximum amplitude for the current $I_{SRC}$ that is based on the amplitude of the current $I_{L1}$ and based on relative gate widths of the transistors in the current path of the current $I_{SRC}$ (e.g., including the P-FET $P_{10}$).

Similarly, the second current limit stage 78 is configured to generate the gain current as a sinking current $I_{SNK}$ that is provided from the first gain stage 66, demonstrated in the example of FIG. 2 as being provided from a drain of the P-FET $P_7$. In the example of FIG. 2, the second current limit stage 78 includes a diode-connected N-FET $N_{11}$ having a common gate connection with an N-FET $N_{12}$ and a common source connection to ground. Therefore, the N-FETs $N_{11}$ and $N_{12}$ cooperate as a current mirror. The second current limit stage 78 also includes a current source 82 that is configured to conduct a substantially constant current $I_{L2}$ from the voltage $V_{DD}$ through the N-FET $N_{11}$ to ground. Therefore, the substantially constant current $I_{L2}$ can define a maximum amplitude for the current $I_{SNK}$ that is based on the amplitude of the current $I_{L2}$ and based on relative gate widths of the transistors in the current path of the current $I_{SNK}$ (e.g., including the N-FET $N_{12}$).

The amplifier circuit 50 also includes a second gain stage 84 and an output stage 86 that are coupled via an output control node 88. The second gain stage 84 is coupled to the first gain stage 66 via a capacitor $C_1$ that interconnects the node 72 and the output control node 88, as well as the N-FET $N_{10}$ and the P-FET $P_8$. In the example of FIG. 2, the second gain stage 84 includes a diode-connected N-FET $N_{13}$ having a common gate connection with an N-FET $N_{14}$ at a drain of the P-FET $P_8$ in the first gain stage 66, and having a common source connection to the voltage $V_N$ (e.g., a negative voltage, such as approximately −17.5V). Similarly, the second gain stage 84 includes a diode-connected P-FET $P_{11}$ having a common gate connection with a P-FET $P_{12}$ at a drain of the N-FET $N_{10}$ in the first gain stage 66, and having a common source connection to the voltage $V_P$ (e.g., a voltage that is equal and opposite the voltage $V_N$, such as approximately 17.5V). The drains of the N-FET $N_{14}$ and the P-FET $P_{12}$ are coupled to the output control node 88. Therefore, the N-FETs $N_{13}$ and $N_{14}$ and the P-FETs $P_{11}$ and $P_{12}$ each respectively cooperate as current mirrors that are configured to conduct the gain current through the first gain stage 66 and mirror the gain current through the output control node 88. As an example, the N-FET $N_{14}$ and the P-FET $P_{12}$ can have a larger gate width relative to the N-FET $N_{13}$ and the P-FET $P_{11}$, respectively, such as based on a fixed proportion (e.g., a gate width that is twice the gate width of the N-FET $N_{13}$ and the P-FET $P_{11}$, respectively).

The output stage 86 includes an N-FET $N_{15}$ and an N-FET $N_{16}$ that are configured in a source-follower arrangement, and thus can provide a low output impedance with respect to an associated output node 90. In the example of FIG. 2, the N-FET $N_{15}$ is diode-connected at the output control node 88, with the N-FETs $N_{15}$ and $N_{16}$ having a common gate and a common source to provide a current mirror configuration. The source of each of the N-FETs $N_{15}$ and $N_{16}$ are coupled to the output node 90 having the output voltage $V_{OUT}$, and the drain of the N-FET $N_{16}$ is coupled to the voltage $V_P$. The output stage 86 also includes an N-FET $N_{17}$ that has a gate coupled to the gates of the N-FETs $N_{13}$ and $N_{14}$ in the second gain stage 84 and which interconnects the output node 90 at a drain and the voltage $V_N$ at a source. Therefore, the N-FET $N_{17}$ is arranged as a current mirror with respect to the N-FET $N_{13}$. The N-FETs $N_{16}$ and $N_{17}$ are therefore configured to conduct the output current based on the gain current that is conducted through the first gain stage 66 and the second gain stage 84. As an example, the N-FET $N_{16}$ can have a gate width that is significantly greater than the gate width of the N-FET $N_{15}$ (e.g., approximately twenty-five times the gate width of the N-FET $N_{15}$). Similarly, the N-FET $N_{17}$ can have a gate width that is significantly greater than the gate width of the N-FET $N_{13}$ (e.g., approximately fifty times the gate width of the N-FET $N_{13}$). Additionally, in the example of FIG. 2, a diode $D_1$ interconnects the source and the drain of the N-FET $N_{15}$ from anode to cathode, respectively. As an example, the diode D1 can be configured as a parasitic diode with respect to the N-FET $N_{15}$. The diode $D_1$ is configured to conduct the output current from the output node 90, as described in greater detail herein.

In the example of FIG. 2, additional currents are demonstrated in the amplifier circuit 50, particularly in the first gain stage 66, the second gain stage 84, and the output stage 86. The currents described hereinafter have current flow directions that are based on positive amplitudes. Therefore, as described herein, a negative amplitude of the currents indicates a current flow in the opposite direction of that demonstrated in the example of FIG. 2.

As a first example, the input voltages $V_{IN\_P}$ and $V_{IN\_N}$ can be approximately equal (e.g., each having an amplitude of approximately 900 mV). In response, with reference to the example of FIG. 2, the voltages $V_{SW1}$ and $V_{SW2}$ can be approximately equal to provide an amplitude of the currents $I_{M1}$ and $I_{M2}$ that are likewise approximately equal. Therefore, the first and second bias voltages $V_{B1}$ and $V_{B2}$ can be approximately equal to the voltages $V_{REF1}$ and $V_{REF2}$, respectively, and the voltage at the node 72 can be approximately equal to the voltage $V_{COM}$, to provide for saturation region activation of the N-FET $N_9$ and the P-FET $P_7$. Therefore, based on the amplitude of the voltage $V_{COM}$ at the node 74 at the sources of the N-FET $N_{10}$ and the P-FET $P_8$, the N-FET $N_{10}$ and the P-FET $P_8$ are also each activated in the saturation region.

In response to the activation of the N-FETs $N_9$ and $N_{10}$ and the P-FETs $P_7$ and $P_8$ in the saturation region, the current $I_{SRC}$ (e.g., approximately 5 µA) is provided from the first current limit stage 76 through the N-FET $N_9$ and a current $I_{CC1}$ (e.g., approximately 39 µA) is provided from the voltage $V_P$ via the P-FET $P_{11}$. A first portion of the current $I_{CC1}$ flows through the P-FET $P_8$ and the N-FET $N_{13}$ as a current $I_{CC2}$ (e.g., approximately 20 µA) to the voltage $V_N$, and a second portion of the current $I_{CC1}$, demonstrated in the example of FIG. 2 as a current $I_{LK}$ (e.g., approximately 19 µA), combines with the current $I_{SRC}$ to flow through the P-FET $P_7$ as the current $I_{SNK}$ (e.g., approximately 24 µA) to the second current limit stage 78. Additionally, based on the current mirror configuration of the P-FET $P_{12}$ relative to the P-FET $P_{11}$ and the N-FET $N_{14}$ relative to the N-FET $N_{13}$, the current $I_{CC1}$ causes a current $I_{GS1}$ (e.g., approximately 78 µA) to flow through the P-FET $P_{12}$ and the current $I_{CC2}$ causes a current $I_{GS2}$ (e.g., approximately 40 µA) to flow through the N-FET $N_{14}$. The current $I_{GS2}$ can be a first portion of the current $I_{GS1}$, and a second portion of the current $I_{GS1}$ can flow through the N-FET $N_{15}$, demonstrated in the example of FIG. 2 as a first output current $I_{OT1}$ (e.g., approximately 38 µA), based on the respective activation of the P-FET $P_{12}$ and the N-FET $N_{14}$.

Additionally, because the N-FET $N_{16}$ is arranged as a current mirror with respect to the N-FET $N_{15}$, and because the N-FET $N_{17}$ is arranged as a current mirror with respect to the N-FET $N_{13}$, a second output current $I_{OT2}$ flows through the N-FET $N_{16}$ and a third output current $I_{OT3}$ flows through the N-FET $N_{17}$. Additionally, a respective portion of the output currents $I_{OT2}$ and $I_{OT3}$ is provided as an output node current $I_{OUT}$ that is demonstrated in the example of FIG. 2 as flowing from the output node 90, such as to external circuit components (e.g., a capacitor). The third output current $I_{OT3}$ and the output node current $I_{OUT}$ can be equal to a sum of the second output current $I_{OT2}$ and the first output current $I_{OT1}$. In the example of the input voltages $V_{IN\_P}$ and $V_{IN\_N}$ being approximately equal in a negative feedback condition (e.g., the output voltage $V_{OUT}$ can be coupled as the input voltage $V_{IN\_N}$ in a voltage-follower configuration), the amplifier circuit 50 can provide the output voltage $V_{OUT}$ without sourcing any current from or sinking any current into the output node 90 from external circuit components. Therefore, in the example of the input voltages $V_{INP}$ and $V_{IN\_N}$ being approximately equal, the output node current $I_{OUT}$ can be approximately equal to zero, such that the third output current $I_{OT3}$ (e.g., approximately 1 mA) can be equal to a sum of the second output current $I_{OT2}$ (e.g., approximately 962 µA) and the first output current $I_{OT1}$.

As another example, the output node 90 can be short-circuited to ground or a reference voltage and the input voltages $V_{IN\_P}$ and $V_{IN\_N}$ can have amplitudes that are not equal. For example, the input voltage $V_{IN\_P}$ can be greater than the input voltage $V_{IN\_N}$ (e.g., by approximately 700 mV). Based on the difference between the input voltages $V_{IN\_P}$ and $V_{IN\_N}$, the voltage $V_{SW1}$ can be greater than the voltage $V_{SW2}$, which can thus result in the voltages $V_{B1}$ and $V_{B2}$ having a relatively low amplitude. As the voltages $V_{B1}$ and $V_{B2}$ decrease in amplitude, the P-FET $P_7$ of the cross-coupled pair of the N-FET $N_{10}$ and the P-FET $P_7$ has a stronger activation (e.g., the P-FET $P_7$ operates in the linear region and the current $I_{SNK}$ achieves a maximum (i.e., limit) amplitude, resulting in a lower activation resistance $R_{DS\_ON}$) than in the normal operating condition (e.g., described previously), and the N-FET $N_{10}$ of the cross-coupled pair of the N-FET $N_{10}$ and the P-FET $P_7$ operates as a cascode stage to conduct the $I_{SNK}$ as a current $I_{LK}$, since the difference between the voltages $V_{REF1}$ and $V_{B2}$ increases, while the voltage $V_{REF1}$ remains at the same amplitude and the voltage $V_{COM}$ decreases, resulting in the gate-source voltages of both the N-FET $N_{10}$ and the P-FET $P_7$ increasing. On the other hand, a lower amplitude of the voltages $V_{B1}$ and $V_{B2}$ results in deactivation of the N-FET $N_9$ and the P-FET $P_8$, since the difference between the voltages $V_{B1}$ and $V_{REF2}$ decreases, which results in the gate-source voltages of both the N-FET $N_9$ and the P-FET $P_8$ decreasing.

Based on the cross-coupling of the N-FET $N_{10}$ and the P-FET $P_7$ with respect to the N-FET $N_9$ and the P-FET $P_8$, the voltage $V_{COM}$ decreases in response to the low amplitudes of the voltages $V_{B1}$ and $V_{B2}$, thus likewise activating the N-FET $N_{10}$ and the P-FET $P_7$ and deactivating the N-FET $N_9$ and the P-FET $P_8$. Therefore, the current $I_{SRC}$ is deactivated and the entirety of the gain current $I_{CC1}$ is sunk to ground as the currents $I_{LK}$ and $I_{SNK}$ (e.g., the currents $I_{CC1}, I_{LK}$, and $I_{SNK}$ can be equal with an amplitude and of approximately 1 mA). As an example, the amplitude of the currents $I_{CC1}$, $I_{LK}$, and $I_{SNK}$ can have an amplitude that is a maximum amplitude defined by the current $I_{L2}$ that flows through the N-FET $N_{11}$ in the second current limit stage 78 and based on the respective gate widths of the transistors through which the respective currents $I_{CC1}$, $I_{LK}$, and $I_{SNK}$ flow.

Based on the current mirror configuration of the P-FET $P_{12}$ relative to the P-FET $P_{11}$, the current $I_{CC1}$ causes a current $I_{GS1}$ (e.g., approximately 2 mA) to flow through the P-FET $P_{12}$. Based on the deactivation of the P-FET $P_8$, the N-FETs $N_{13}$, $N_{14}$, and $N_{17}$ can also be likewise deactivated. Therefore, the currents $I_{CC2}$, $I_{GS2}$, and $I_{OT3}$ can be zero. The current $I_{GS1}$ can therefore flow in its entirety through the N-FET $N_{15}$ as the first output current $I_{OT1}$ to be combined with the second output current $I_{OT2}$ (e.g., approximately 50 mA based on a relative gate width of the N-FET $N_{16}$). Therefore, the output node current $I_{OUT}$ can flow from the output node 90 at an amplitude that is limited to a maximum amplitude (e.g., approximately 52 mA) based on the limit amplitude of the gain current $I_{SNK}$ (e.g., 1 mA), as defined by the second current limit stage 78. Accordingly, the amplitude limit of the output node current $I_{OUT}$ defined by the second current limit stage 78 can substantially mitigate damage to the amplifier circuit 50 and/or to circuit components coupled to the output node 90.

As yet another example, the output node 90 can be short-circuited to ground or a reference voltage and the input voltage $V_{IN\_N}$ can be greater than the input voltage $V_{IN\_P}$ (e.g., by approximately 700 mV). Based on the difference between the input voltages $V_{IN\_P}$ and $V_{IN\_N}$, the voltage $V_{SW2}$ can be greater than the voltage $V_{SW1}$, which can thus result in the voltages $V_{B1}$ and $V_{B2}$ having a relatively high amplitude. As the voltages $V_{B1}$ and $V_{B2}$ increase in amplitude, the N-FET $N_9$ of the cross-coupled pair of the N-FET $N_9$ and the P-FET $P_8$ has a stronger activation (e.g., the N-FET $N_9$ operates in the linear region and the current $I_{SRC}$ achieves a maximum (i.e., limit) amplitude, resulting in a lower activation resistance $R_{DS\_ON}$) than in the normal operating condition (e.g., described previously), and the P-FET $P_8$ of the cross-coupled pair of the N-FET $N_9$ and the P-FET $P_8$ operates as a cascode stage to conduct the $I_{SRC}$ as the current $I_{LK}$ (negative with respect to the example of FIG. 2), since the difference between the voltages $V_{REF2}$ and $V_{B1}$ increases, while the voltage $V_{REF2}$ remains at the same amplitude and the voltage $V_{COM}$ increases, resulting in the gate-source voltages of both the N-FET $N_9$ and the P-FET $P_8$ increasing. Additionally, a higher amplitude of the voltages $V_{B1}$ and $V_{B2}$ results in deactivation of the N-FET $N_{10}$ and the P-FET $P_7$, since the difference between the voltages $V_{B2}$ and $V_{REF1}$ decreases, which results in the gate-source voltages of both the N-FET $N_{10}$ and the P-FET $P_7$ decreasing, Based on the cross-coupling of the N-FET $N_{10}$ and the P-FET $P_7$ with respect to the N-FET $N_9$ and the P-FET $P_8$, the voltage $V_{COM}$ increases in response to the high amplitudes of the voltages $V_{B1}$ and $V_{B2}$, thus likewise activating the P-FET $P_8$ and the N-FET $N_9$ and deactivating the N-FET $N_{10}$ and the P-FET $P_7$. Therefore, the current $I_{SNK}$ is deactivated and the gain current $I_{SRC}$ is provided through the first gain stage 66 as the currents $I_{LK}$ (i.e., negative with respect to the example of FIG. 2) and $I_{CC2}$ (e.g., the currents $I_{SRC}$, $I_{LK}$, and $I_{CC2}$ can be equal with an amplitude of approximately 1 mA). As an example, the amplitude of the currents $I_{CC2}$, $I_{LK}$, and $I_{SRC}$ can have an amplitude that is a maximum amplitude defined by the current $I_{L1}$ that flows through the P-FET $P_9$ in the first current limit stage 76 and based on the respective gate widths of the transistors through which the respective currents $I_{CC2}$, $I_{LK}$, and $I_{SRC}$ flow.

Based on the current mirror configuration of the N-FET $N_{14}$ relative to the N-FET $N_{13}$, the current $I_{CC2}$ causes a current $I_{GS2}$ (e.g., approximately 2 mA) to flow through the N-FET $N_{14}$. Based on the deactivation of the N-FET $N_{10}$, the P-FETs $P_{11}$ and $P_{12}$ can also be likewise deactivated. Accordingly, the N-FETs $N_{15}$ and $N_{16}$ can also be deactivated. Therefore, the currents $I_{CC1}$, $I_{GS1}$, and $I_{OT2}$ can be zero. The current $I_{GS2}$ can therefore flow as a portion of the output node current $I_{OUT}$ (i.e., negative with respect to the example of FIG. 2) from the output node 90 as the first output current $I_{OT1}$ (i.e., negative with respect to the example of FIG. 2) through the diode $D_1$. The remainder of the output node current $I_{OUT}$ can be provided as the third output current $I_{OT3}$ (e.g., approximately 50 mA based on a relative gate width of the N-FET $N_{17}$). Therefore, the output node current $I_{OUT}$ can flow into the output node 90 at an amplitude that is limited to a maximum amplitude (e.g., approximately 52 mA) based on the limit amplitude of the gain current $I_{SRC}$ (e.g., 1 mA), as defined by the first current limit stage 76. Accordingly, the amplitude limit of the output node current $I_{OUT}$ defined by the first current limit stage 76 can substantially mitigate damage to the amplifier circuit 50 and/or to circuit components coupled to the output node 90.

Figure 3:
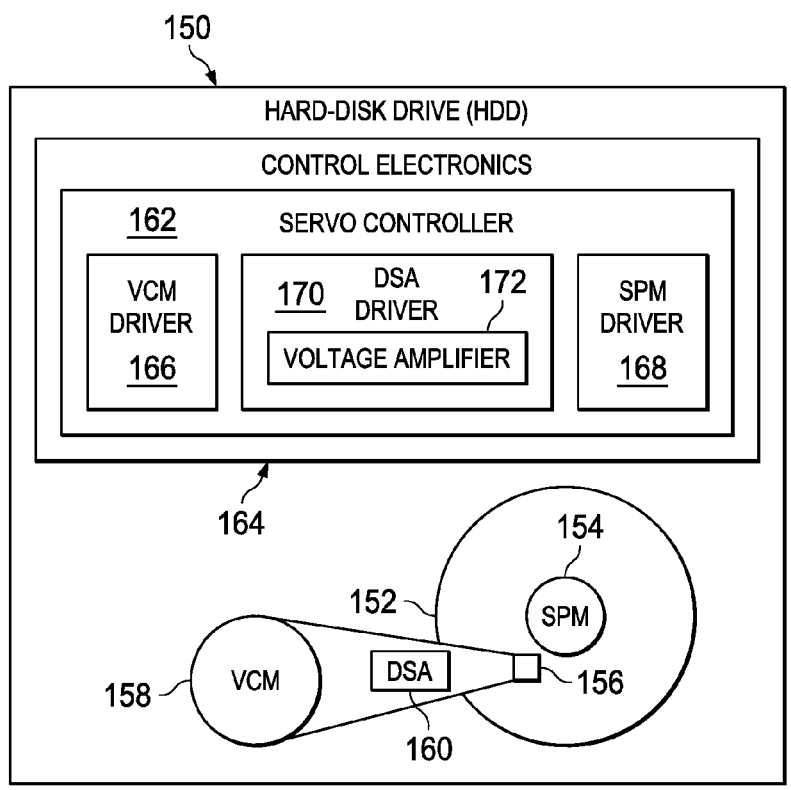
FIG. 3 illustrates an example of a hard-disk drive (HDD) system.

FIG. 3 illustrates an example of an HDD system 150. The HDD system 150 can be implemented in a variety of computer applications for writing data to and reading data from a hard-disk drive. The HDD system 150 includes a magnetic disk 152 that acts as a spinning magnetic storage medium to which data can be written and from which data can be read. The HDD system 150 also includes a spindle motor (SPM) 154 that is configured to spin the magnetic disk during disk write/read operations. A head 156 is configured to perform the read/write operations with respect to the magnetic disk 152 based on positioning over the magnetic disk 152. The positioning of the head 156 can be provided in a precise manner by a voice coil motor (VCM) 158 and a dual-stage actuator (DSA) 160. The DSA 160 can receive actuator signals from a servo controller 162, such as can be implemented as at least a portion of an integrated circuit (IC) as part of control electronics 164 that are configured to control the HDD system 150. The servo controller 162 includes a VCM driver 166 configured to control the VCM 158, an SPM driver 168 configured to control the SPM 154, and a DSA driver 170 configured to control the DSA 160. In the example of FIG. 3, the DSA driver 170 includes a voltage amplifier 172. As an example, the voltage amplifier 172 can be configured substantially similar to the amplifier system 10 in the example of FIG. 1 or the amplifier circuit 50 in the example of FIG. 2.

As an example, the DSA driver 170 can be configured to provide the actuator signals that can be amplified by a voltage amplifier 172 to the DSA 160 to provide precise positioning of the head 156 over the magnetic disk 152. Therefore, the voltage amplifier 172 can provide an amplified output voltage that corresponds to an input voltage, such as a differential input voltage. Furthermore, the voltage amplifier 172 can be configured to exhibit current limiting with respect to an output current, such as based on including at least one current limit stage. Therefore, damage to the voltage amplifier 172 and/or the DSA 160 from excessive current, such as based on an associated output of the voltage amplifier 172 being short-circuited, can be substantially mitigated.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

The invention claimed is:

1. An amplifier system comprising:
   a gain stage configured to conduct a gain current in response to an input voltage;
   a current limit stage coupled to the gain stage and being configured to one of source and sink the gain current and to define a limit amplitude of the gain current during a current limit condition, wherein the current limit stage comprises a first transistor and a second transistor being arranged as a current mirror and a current source, wherein a predetermined current is provided from the current source through the first transistor, and wherein the second transistor is configured to one of source and sink the gain current based on the predetermined current through the first transistor; and
   an output stage coupled to the gain stage and configured to conduct an output current through an output node in response to the gain current, the output current having a maximum amplitude during the current limit condition that is proportional to the limit amplitude.

2. An amplifier system comprising:
   a gain stage configured to conduct a gain current in response to a differential input voltage, the differential input voltage comprising a first input voltage and a second input voltage; and
   a current limit stage coupled to the gain stage and being configured to one of source and sink the gain current and to define a limit amplitude of the gain current during a current limit condition, wherein the current limit stage comprises:
      a first current limit stage configured to source the gain current through the gain stage based on a negative difference between the first input voltage and the second input voltage; and
      a second current limit stage configured to sink the gain current through the gain stage based on a positive difference between the first input voltage and the second input voltage, the system further comprising:
   an output stage coupled to the gain stage and configured to conduct an output current through an output node in response to the gain current, the output current having a maximum amplitude during the current limit condition that is proportional to the limit amplitude.

3. The system of claim 1, wherein the output stage comprises a source-follower arrangement of transistors, such that the output stage one of sources and sinks the output current provided out from or into the output node during a current limit condition.

4. An amplifier system comprising:
   a gain stage configured to conduct a gain current in response to an input voltage, wherein the gain stage comprises a plurality of transistors that are configured as a cross-coupled transistor arrangement configured to sink the gain current through a first pair of transistors of the cross-coupled transistor arrangement during a sinking current limit condition and to source the gain current through a second pair of transistors of the cross-coupled transistor arrangement during a sourcing current limit condition;
   a current limit stage coupled to the gain stage and being configured to one of source and sink the gain current and to define a limit amplitude of the gain current during a current limit condition; and
   an output stage coupled to the gain stage and configured to conduct an output current through an output node in response to the gain current, the output current having a maximum amplitude during the current limit condition that is proportional to the limit amplitude.

5. The system of claim 4, wherein a first transistor of the first pair of transistors and a first transistor of the second pair of transistors are controlled by respective predetermined reference voltages, and wherein a second transistor of the first pair of transistors and a second transistor of the second pair of transistors are controlled by the input voltage.

6. The system of claim 5, further comprising a reference stage coupled to the first transistor of the first pair of transistors and the first transistor of the second pair of transistors as respective current mirrors, the reference stage being configured to set a magnitude of the predetermined reference voltages based on a reference current.

7. The system of claim 6, wherein the input voltage is a differential voltage comprising a first input voltage and a second input voltage, the system further comprising:
   a first control node associated with the first input voltage and being coupled to a source of a first reference transistor that is controlled via a second of the predetermined reference voltages; and
   a second control node associated with the second input voltage and being coupled to a source of a second reference transistor that is controlled via the second of the predetermined reference voltages;
   wherein the second transistor of the first pair of transistors is controlled via activation of the first reference transistor in response to the first input voltage and the second transistor of the second pair of transistors is controlled via activation of the second reference transistor in response to the second input voltage.

8. The system of claim 4, wherein the gain stage is a first gain stage, the system further comprising a second gain stage comprising a first gain stage current mirror and a second gain stage current mirror, wherein a first transistor of the first pair of transistors is coupled to the first gain stage current mirror and a first transistor of the second pair of transistors is coupled to the second gain stage current mirror, wherein the output stage is coupled to the first gain stage current mirror and the second gain stage current mirror, such that the gain current controls the magnitude of the output current via the respective first and second gain stage current mirrors.

9. The system of claim 8, wherein the output stage comprises a first output transistor, a second output transistor, an output control transistor, and a diode, wherein the first output transistor and the output control transistor are arranged in a source-follower configuration, wherein the first output transistor and the output control transistor are configured to conduct the output current to flow from the output node in response to the sourcing current limit condition, and wherein the second output transistor and the diode are configured to conduct the output current that is provided from the output node in response to the sinking current limit condition.

10. A voltage amplifier system comprising:
   a gain stage comprising a plurality of transistors configured to conduct at least one of a sinking current and a sourcing current in response to an input voltage, wherein the plurality of transistors are configured as a cross-coupled transistor arrangement configured to conduct the sinking current through a first pair of transistors of the cross-coupled transistor arrangement during a sinking current limit condition and to conduct the sourcing current through a second pair of transistors of the cross-coupled transistor arrangement during a sourcing current limit condition;

at least one current limit stage comprising a current mirror configured to provide the at least one of the sinking current and the sourcing current and to define a limit amplitude of the at least one of the sinking current and the sourcing current during a current limit condition; and an output stage coupled to the gain stage and configured to conduct an output current through an output node in response to the at least one of the sinking current and the sourcing current to provide an output voltage at the output node, the output current having a maximum amplitude during the current limit condition that is proportional to the limit amplitude.

11. The system of claim 10, wherein a first transistor of the first pair of transistors and a first transistor of the second pair of transistors are controlled by respective predetermined reference voltages, and wherein a second transistor of the first pair of transistors and a second transistor of the second pair of transistors are controlled by the input voltage.

12. The system of claim 11, wherein the gain stage is a first gain stage, the system further comprising a second gain stage comprising a first gain stage current mirror and a second gain stage current mirror, wherein the first transistor of the first pair of transistors is coupled to the first gain stage current mirror and the first transistor of the second pair of transistors is coupled to the second gain stage current mirror, wherein the output stage is coupled to the first gain stage current mirror and the second gain stage current mirror, such that the sinking current and the sourcing current control the magnitude of the output current via the respective first and second gain stage current mirrors.

13. The system of claim 12, wherein the output stage comprises a first output transistor, a second output transistor, an output control transistor, and a diode, wherein the first output transistor and the output control transistor are arranged in a source-follower configuration, wherein the first output transistor and the output control transistor are configured to conduct the output current to flow from the output node in response to the sourcing current limit condition, and wherein the second output transistor and the diode are configured to conduct the output current that is provided from the output node in response to the sinking current limit condition.

\* \* \* \* \*